United States Patent
Tang et al.

(10) Patent No.: US 9,693,475 B2
(45) Date of Patent: Jun. 27, 2017

(54) DISPLAY DEVICE (71) Applicants: BOE Technology Group Co., Ltd., Beijing (CN); Beijing BOE Display Technology Co., Ltd., Beijing (CN)

(72) Inventors: Wulijibaier Tang, Beijing (CN); Chunbing Zhang, Beijing (CN)

(73) Assignees: BOE TECHNOLOGY GROUP CO., LTD., Beijing (CN); BEIJING BOE DISPLAY TECHNOLOGY CO., LTD, Beijing (CN)

(*) Notice: Subject to any disclaimer, the term of this patent is extended or adjusted under 35 U.S.C. 154(b) by 0 days.

(21) Appl. No.: 14/065,623

(22) Filed: Oct. 29, 2013

(65) Prior Publication Data
US 2014/0118911 A1  May 1, 2014

(30) Foreign Application Priority Data

Oct. 29, 2012  (CN) .......................... 2012 1 0421261

(51) Int. Cl.
G02F 1/1333 (2006.01)
H05K 5/02 (2006.01)
H05K 7/14 (2006.01)

(52) U.S. Cl.
CPC ......... *H05K 7/14* (2013.01); *G02F 1/133308* (2013.01); *H05K 5/02* (2013.01);
(Continued)

(58) Field of Classification Search
CPC .......... H05K 7/14; H05K 5/02; H05K 5/0221; G02F 1/133308; G02F 2001/133314;
(Continued)

(56) References Cited

U.S. PATENT DOCUMENTS 6,236,383 B1 * 5/2001 Nakajima ............. G02F 1/1358
345/86
6,310,526 B1 * 10/2001 Yip et al. ..................... 333/262
(Continued)

FOREIGN PATENT DOCUMENTS

CH       701 355 A    12/2010
CN       2724038 Y     9/2005
(Continued)

OTHER PUBLICATIONS

English translation of DE 202009008005 U1, Title: Display device and display element, Author: Friesacher, Marco, Sonntag, Achim; Date of publication: Sep. 17, 2009.*
(Continued)

*Primary Examiner* — Dung Nguyen
*Assistant Examiner* — Shan Liu
(74) *Attorney, Agent, or Firm* — Haug Partners LLP (57) ABSTRACT

The present invention discloses a display device. The display device includes a display panel and a module at the back side of the display panel, the module includes a back plate and a mold frame which is provided between the back plate and the display panel, the display device further includes a magnetic device, and the display panel and the mold frame are attached to each other and detached from each other by the magnetic device. In the present invention, the display panel is fixedly attached to the mold frame of the module through a magnetic field, avoiding the problem that the display panel is unable to be detached from the module when they are fixed with a double-sided adhesive, so as to achieve the effect that the display device is frameless while facilitating subsequent maintenance.

13 Claims, 3 Drawing Sheets

(52) U.S. Cl.
CPC ............... *H05K 5/0221* (2013.01); *G02F 2001/133314* (2013.01); *G02F 2001/133317* (2013.01); *G02F 2201/46* (2013.01)

(58) Field of Classification Search
CPC ..... G02F 2001/133317; G02F 2201/46; G02F 1/133608; G02F 2001/133311; G02F 2001/13332; G02F 2001/133322; G02F 2001/133325; G02F 2001/133328; G02F 2001/133331; G02F 2001/133334
USPC .............................................. 349/58, 59, 60
See application file for complete search history.

(56) References Cited

U.S. PATENT DOCUMENTS

| | | | |
|---|---|---|---|
| 2002/0071066 A1* | 6/2002 | Silverbrook .................. 349/58 |
| 2002/0167626 A1* | 11/2002 | Matsuda et al. .............. 349/65 |
| 2004/0150614 A1* | 8/2004 | Seo .................. G02F 1/091 345/111 |
| 2006/0055515 A1* | 3/2006 | Yatsu ............... G09B 21/004 340/407.2 |
| 2008/0062147 A1* | 3/2008 | Hotelling ........... G02F 1/13338 345/174 |
| 2009/0027583 A1* | 1/2009 | McBroom et al. ............ 349/58 |
| 2009/0115929 A1* | 5/2009 | Baek ............... G02F 1/133608 349/58 |
| 2010/0007807 A1* | 1/2010 | Galstian ............ G02F 1/13768 349/23 |
| 2011/0043714 A1* | 2/2011 | Chang ........................... 349/15 |
| 2012/0206680 A1* | 8/2012 | Onishi ............. G02F 1/134336 349/122 |

FOREIGN PATENT DOCUMENTS

| | | | |
|---|---|---|---|
| CN | 202057924 U | | 11/2011 |
| DE | 202009008005 U1 | * | 9/2009 |
| DE | 20 2009 015 698 U | | 4/2010 |
| JP | 2006284932 A | * | 10/2006 |
| JP | 2008-165367 | | 7/2008 |
| JP | 3144355 U | | 8/2008 |
| KR | 10-2008-0001929 | | 1/2008 |
| KR | 2008-0001929 A | | 1/2008 |

OTHER PUBLICATIONS

English translation of JP 2006284932 A, Title: Display Panel, Display Device and Manufacturing Method for Display Panel, Author: Mizuno Kimiyasu; Date of publication: Oct. 19, 2006.*
First Office Action and Search Report issued by Chinese Patent Office for priority application 201210421261.1 dated Aug. 15, 2014 with English translation.
Search Report issued by European Patent Office for corresponding European application 13 19 0092 dated Jan. 29, 2014.
Notice of Rejection from Korean Intellectual Property Office for corresponding Korean application 10-2013-0129278 dated Dec. 4, 2015 with English translation.
Office Action issued in corresponding Korean Application No. 10-2016-0069427 dated Aug. 22, 2016 and its English Translation.

* cited by examiner

DISPLAY DEVICE

FIELD OF THE INVENTION

The present invention relates to display technology, and particularly, to a display device.

BACKGROUND OF THE INVENTION

Currently, in the field of liquid crystal display technology, a liquid crystal display device tends to be frameless. A frameless liquid crystal display device has following advantages: 1) the display area of the liquid crystal display device is effectively increased, and an ultra wide screen is achieved; 2) the appearance is simple while natural, and the decorations are few while a high level is shown; 3) it is lighter and thinner compared with traditional liquid crystal display devices, so that a flat panel television using the frameless liquid crystal display device is gradually transforming to an important decoration from a household electrical appliance; and 4) a flat panel television using the frameless liquid crystal display device has wider view in watching experience, especially when a moving picture is played, a visual stimulation of getting out of the frame is achieved.

Just due to the above advantages, the frameless liquid crystal display device is becoming the mainstream of liquid crystal display products. The liquid crystal display device usually comprises: a liquid crystal display panel and a backlight module which are assembled together through a bezel structure. To achieve the frameless effect of the liquid crystal display device, the bezel structure needs to be cancelled. After the bezel structure is cancelled, the liquid crystal display panel and the mold frame of the backlight module need to be adhered together through a double-sided adhesive, so as to achieve the fixed connection between the liquid crystal display panel and the mold frame of the backlight module in the frameless mode and then to achieve the fixed connection between the liquid crystal display panel and the backlight module. However, when the liquid crystal display device needs to be reworked due to defect, as the liquid crystal display panel is fixedly connected with the mold frame of the backlight module through the double-side adhesive, the liquid crystal display panel and the backlight module cannot be disassembled.

In view of above, in the prior art, there is no technology which can facilitate subsequent maintenance and achieve the frameless effect of the liquid crystal display device.

SUMMARY OF THE INVENTION

The present invention provides a display device for achieving the frameless effect of the display device through a solution of convenient subsequent maintenance.

To achieve the above object, the present invention provides a display device comprising a display panel and a module at the back side of the display panel, and the module comprises a back plate and a mold frame, wherein, the mold frame is provided between the back plate and the display panel, and the display device further comprises a magnetic device, and the display panel and the mold frame are attached to each other and detached from each other through the magnetic device.

Optionally, the magnetic device comprises one or more magnets which are fixedly attached to the display panel and provided between the display panel and the mold frame, and the magnets are attracted to the mold frame through magnetic field they generate so that the display panel is fixedly attached to the mold frame through the magnets.

Optionally, polarities at positions on the mold frame corresponding to the magnet are opposite to that of the magnets, or a metal sheet which can be attracted to the magnets are provided at the positions on the mold frame corresponding to the magnets.

Optionally, the magnetic device comprises one or more magnets which are fixedly attached to the mold frame and provided between the display panel and the mold frame, and the magnets are attracted to the display panel through the magnetic field they generate so that the display panel is fixedly attached to the mold frame through the magnets.

Optionally, polarity at a position on the display panel corresponding to the magnet is opposite to that of the magnet, or metal sheets which can be attracted to the magnets are provided at the positions on the display panel corresponding to the magnets.

Optionally, the magnetic device comprises a magnetic force adjustable member for adjusting attraction between the display panel and the mold frame.

Optionally, the magnetic force adjustable member comprises electromagnetic coils formed at corresponding positions on the display panel, wherein, when the electromagnetic coils are powered on, they generate magnetic force to allow the display panel and the mold frame attract mutually; and when the electromagnetic coils are powered off, they stop generating magnetic force to allow the display panel and the mold frame to separate from each other.

Optionally, the mold frame has a polarity opposite to that generated when the electromagnetic coils are powered on at positions corresponding to the electromagnetic coils, or the mold frame is provided with metal sheets which can be attracted by magnetic force generated when the electromagnetic coils are powered on at positions corresponding to the electromagnetic coils.

Optionally, the magnetic device further comprises a magnetic force adjustable member for adjusting attraction between the display panel and the mold frame.

Optionally, the magnetic force adjustable member comprises one or more electromagnetic coils formed at positions on the display panel corresponding to the magnets, wherein, when detaching the display panel from the mold frame, the electromagnetic coils are powered on so as to generate repulsion force between the display panel and the mold frame, which is larger than attraction force between the display panel and the mold frame.

Optionally, the magnetic force adjustable member comprises one or more electromagnetic coils formed at positions on the display panel corresponding to the magnets, wherein, during normal operation of the display device, the electromagnetic coils are powered on so as to generate magnetic force with which the display panel and the mold frame are attracted mutually.

Optionally, the magnets are adhere to the display panel through a double-sided adhesive tape.

Optionally, the magnet are adhered to the mold frame through a double-sided adhesive tape.

Optionally, the magnet are permanent soft magnets.

Optionally, each of the electromagnetic coils comprises a plurality of layers of metal pattern, a passivation layer is formed between two adjacent layers of metal pattern, two layers of metal pattern are interconnected through a via hole formed in the passivation layer, and among the plurality of layers of metal pattern, the first layer of metal pattern and the last layer of metal pattern are connected with two electrodes of a power supply through leads respectively.

Optionally, the display panel is a liquid crystal display panel which comprises a first substrate and a second substrate arranged opposite to each other; wherein the plurality of layers of metal pattern are formed in the first substrate and/or the second substrate.

Optionally, the first substrate is an array substrate and the second substrate is a color filter substrate.

Optionally, the display device further comprises one more buffer pads located between the display panel and the mold frame.

Optionally, the buffer pads are located on the magnets.

Optionally, the module is a backlight module which further comprises a backlight unit and the back plate is located outside the backlight unit.

Optionally, the display device is an organic light emitting diode display device, and the display panel is an organic light emitting diode display panel.

The present invention achieves the following advantageous effects:

in the display device provided by embodiments of the present invention, the display panel and the mold frame of the module are attached or detached by the magnetic device, so that the problem of being unable to detach the display panel from the module when fixing is performed with a double-sided adhesive is avoided, thus achieving the frameless effect of the display device while facilitating subsequent maintenance.

DETAILED DESCRIPTION OF THE INVENTION

In order to allow persons skilled in the art better understand technical solutions of the present invention, the display device provided by the present invention will be described in detail hereinafter in connection with the accompanying drawings.

The present invention provides a display device comprising a display panel and a module at the back side of the display panel, and the module comprises: a back plate and a mold frame which is provided between the back plate and the display panel. The display device also comprises a magnetic device, and the display panel and the mold frame are attached to each other or detached from each other by the magnetic device. The display device can be a liquid crystal display device, an organic light emitting diode display device, a plasma display device and etc.

In the display device provided by the present invention, attachment of the display panel to the mold frame of the module or detachment of the display panel from the mold frame of the module is achieved by means of the magnetic device, so that the problem of being unable to detach the display panel from the module when they are fixed connected with a double-sided adhesive is avoided, thus achieving the frameless effect of the display device while facilitating subsequent maintenance.

Figure 1:
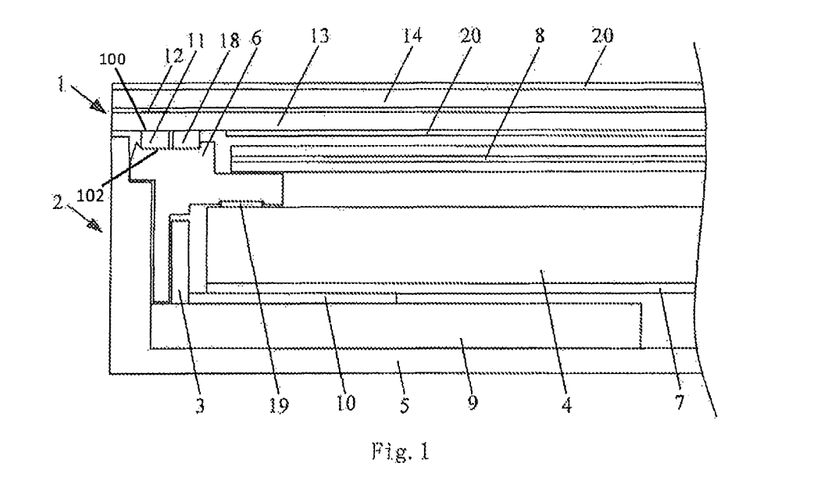
FIG. 1 is a sectional view of structure of a liquid crystal display device provided by a first embodiment of the present invention.

FIG. 1 is a sectional view of structure of a liquid crystal display device provided by the first embodiment of the present invention. As shown in FIG. 1, the liquid crystal display device comprises: a liquid crystal display panel 1 and a backlight module 2 at the back side of the liquid crystal display panel 1, the backlight module 2 comprises: a backlight unit, a back plate 5 and a mold frame 6, and the back plate 5 is located outside the backlight unit, the mold frame 6 is provided between the back plate 5 and the liquid crystal display panel 1, the mold frame 6 is fixedly attached to the back plate 5, and the liquid crystal display panel 1 and the mold frame 6 are attached to each other or detached from each other by a magnetic device.

In other words, attachment and detachment between the liquid crystal display panel 1 and the mold frame 6 are achieved by magnetic force generated by the magnetic device.

In this embodiment, the backlight unit may comprise: a light source 3 and a light guide plate 4. The back plate 5 is located outside the light source 3 and the light guide plate 4. In this embodiment, a side-type backlight unit is taken as an example for description. The light source 3 in this embodiment is an LED light source and is located at the side of the light guide plate 4.

Optionally, in practical applications, the backlight unit may also be a direct-type backlight unit which may comprise a light source and a diffusion plate, and the light source is located at the back side of the diffusion plate, which is not specifically shown herein.

The back plate 5 envelops outside the light source 3 and the light guide plate 4 so that the light source 3 and the light guide plate 4 are located inside the back plate 5.

The mold frame 6 is supported between the back plate 5 and the liquid crystal display panel 1, and the liquid crystal display panel 1 and the backlight module 2 are assembled together to be a liquid crystal display device by the back plate 5 and the mold frame 6.

Optionally, the liquid crystal display device may further comprise a reflection plate 7 which is located between the light guide plate 4 and the back plate 5. The reflection plate 7 mainly serves to reflect fight radiated from the back side of the light guide plate 4 back into the light guide plate 4. As a plurality of light guide mesh points are provided on the bottom surface (i.e. the side opposite to the back side of the light guide plate) of the light guide plate 4 and have gaps therebetween, when light emitted from the light source 3 is incident on the bottom surface of the light guide plate 4 via the side edge of the light guide plate 4, only a part of the light forms a uniform surface Eight source after being diffused by the light guide mesh points on the bottom surface of the light guide plate 4 and is then emitted to the liquid crystal display panel 1 from the light exiting surface of the light guide plate 4, and another part of the light passes through the gaps between the light guide mesh points and is radiated out of the back side of the Eight guide plate 4. Then, the reflection plate 7 reflects the another part of light radiated out of the back side of the light guide plate 4 back into the Eight guide plate 4, and thereby utilization efficiency of light energy can be improved.

Optionally, the liquid crystal display device may further comprise an optical film lager 8 which is located between the liquid crystal display panel 1 and the light guide plate 4. The optical film layer 8 may comprise a lens sheet and a diffusion film. Wherein, the lens sheet can serve to focus light, and thereby brightness of the product can be improved; the diffusion film can uniformly scatter the light to improve the uniform distribution of the light for the product, and haze at the surface of the product can be improved when the diffusion film is used as a protection sheet.

Optionally, the liquid crystal display device may further comprise a heat sink block 9 which is located between the back plate 5 and the light guide plate 4. The heat sink block 9 is usually used together with the light source 3, and the light source 3 will generate heat in normal operating state, if heat from the light source 3 cannot be released in time, performance of the whole product will be affected, so that a defective phenomenon will occur in the backlight module. Therefore, the heat sink block 9 is additionally provided in the liquid crystal display device to release heat generated by the light source 3 in its operating state, and thereby the defective phenomenon occurring in the backlight module can be avoided.

Optionally, the liquid crystal display device may further comprise an auxiliary adhesive tape 10 which is provided between the light guide plate 4 and the back plate 5 for adjusting the relative position between the light guide plate 4 and the light source 3. Specifically, when the liquid crystal display device comprises the reflection plate 7 and the heat sink block 9, the auxiliary adhesive tape 10 can be adhered between the reflection plate 7 and the heat sink block 9.

In this embodiment, preferably, the magnetic device comprises one or more magnets 11. The one or more magnets 11 are fixedly attached to the liquid crystal display panel 1 and provided between the liquid crystal display panel 1 and the mold frame 6, and are attracted to the mold frame 6 through magnetic force they generate, so that the liquid crystal display panel 1 and the mold frame 6 may be fixed attached each other through the one or more magnets 11. Optionally, the mold frame 6 is provided with magnets, the polarities of which are opposite to that of the magnets 11, at positions thereon corresponding to the respective magnets 11. Wherein, the magnets 11 are permanent magnets which may be permanent ferromagnets, and have the same polarities.

Preferably, the polarities at positions, corresponding to the respective magnets 11, on the surface of the mold frame 6 are opposite to that of the magnets 11, preferably, at least parts of the mold frame 6 facing to the respective magnets 11 are made of metal. Thus, mutual attraction between the mold frame 6 and the respective magnets 11 is achieved. During actual production, the surface of the mold frame 6 can be magnetized at positions corresponding to the magnets 11, so that the polarities at positions, corresponding to the magnets, on the surface of the mold frame 6 are opposite to those of the magnets 11.

In this embodiment, the magnetic device may at least comprise one magnetic force adjustable member for adjusting the magnetic force to detach the liquid crystal display panel from the mold frame.

Preferably, the magnetic force adjustable member may comprise one or more electromagnetic coils 12 formed at positions on the liquid crystal display panel 1 corresponding to the magnets 11, and each electromagnetic coil 12 has a polarity opposite to that of the magnet 11 when it is powered on, and repulsion force between the electromagnetic coil 12 and the mold frame 6 is larger than attraction force between the magnets 11 and the mold frame 6, thus mutual repulsion between the electromagnetic coil 12 and the mold frame 6 is achieved so as to detach the mutually attracting magnets 11 and mold frame 6 from each other. Wherein, the liquid crystal display panel 1 comprises a display area and a peripheral area at the periphery of the display area, i.e., a non-display area, and the positions on the liquid crystal display panel 1 corresponding to the magnets 11 are within the peripheral area. The liquid crystal display panel 1 may comprise an array substrate 13 and a color filter substrate 14 arranged opposite to each other, a liquid crystal layer is filled between the array substrate 13 and the color filter substrate 14, a spacer pad is supported between the array substrate 13 and the color filter substrate 14, and a seal agent is formed between the array substrate 13 and the color filter substrate 14, wherein, the liquid crystal layer, the spacer pad and the seal agent are not specifically shown. Then positions on the liquid crystal display panel 1 corresponding to the magnets 11 comprise positions on the array substrate 13 corresponding to the magnets 11 and/or positions on the color filter substrate 14 corresponding to the magnets 11. That is to say, the electromagnetic coils 12 may be formed at positions on the array substrate 13 corresponding to the magnets 11, or the electromagnetic coils 12 may be formed at positions on the color filter substrate 14 corresponding to the magnets 11, or each of the electromagnetic coils 12 can be respectively formed at a position on the array substrate 13 corresponding to the magnet 11 and at the position on the color filter substrate 14 corresponding to the magnet 11. Wherein, forming a electromagnetic coil 12 respectively at a position on the array substrate corresponding to the magnets 11 and at the position on the color filter substrate 14 corresponding to the magnets 11 refers to that one part of a electromagnetic coil 12 is formed at the position on the array substrate 13 corresponding to the magnets 11 and the other part thereof is formed at the position on the color filter substrate 14 corresponding to the magnets 11. For example, one part of a electromagnetic coil 12 is formed at a position at the front side of the array substrate 13 corresponding to a magnet 11 and the other part thereof is formed at the position at the front side of the color filter substrate 14 corresponding to the magnet 11, so that the two parts of the electromagnetic coil are arranged opposite to each other. Wherein, the front side of the array substrate refers to the surface of the array substrate close to the liquid crystal layer after it is assembled with the color filter substrate, and the front side of the color filter substrate refers to the surface of the color filter substrate close to the liquid crystal layer after it is assembled with the array substrate; correspondingly, the back side of the array substrate refers to the surface of the array substrate far from the liquid crystal layer after it is assembled with the color filter substrate, and the back side of the color filter substrate refers to the surface of the color filter substrate far from the liquid crystal layer after it is assembled with the array substrate. In FIG. 1 of this embodiment, description is made by taking as an example that only one electromagnetic coil 12 is formed at a position on the array substrate 13 corresponding to one magnet 11. In addition, in this embodiment description is made by taking as an example that the electromagnetic coil 12 and the magnet 11 are all formed at the display panel. However, arranging the magnets on the mold frame while arranging the electromagnetic coil on the display panel care also achieve the same technical effects as in the present embodiment.

Figure 2A:
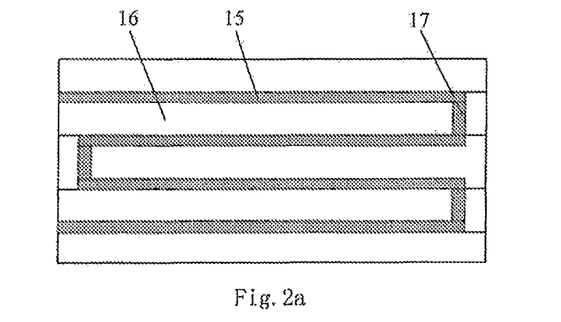
FIG. 2a is a schematic diagram of structure of one electromagnetic coil in FIG. 1.

FIG. 2a is a schematic diagram of structure of the electromagnetic coil in FIG. 1. As shown in FIG. 2a, the electromagnetic coil comprises a plurality of layers of metal pattern 15, a passivation layer 16 is formed between two adjacent layers of metal pattern 15, two adjacent layers of metal pattern 15 are interconnected through a via hole 17 formed in the passivation layer 16, and the first layer of metal pattern 15 and the last layer of metal pattern 15 in the plurality of layers of metal pattern 15 are connected with two electrodes of a power supply by leads respectively, so as to form the electromagnetic coil. Specifically, the passivation layer 16 is provided with the via hole 17, and the metal pattern 15 is filled into the via hole 17, so that two adjacent layers of metal pattern 15 are connected through the via hole 17. Taking FIG. 2a as an example, the uppermost layer of metal pattern 15 and the lowermost layer of metal pattern 15 can be connected with two electrodes of a power supply through leads respectively, so as to form the electromagnetic coil. Furthermore, a passivation layer 16 may be formed above the uppermost layer of metal pattern 15. Furthermore, a passivation layer 16 may be formed below the lowermost layer of metal pattern 15. Preferably, the structure of the electromagnetic coil shown in FIG. 2a may be etched to form the structure shown in FIG. 2b. FIG. 3 is an equivalent schematic diagram of the electromagnetic coil in FIG. 2a. As shown in FIG. 3, the structure of the multilayered metal pattern of the electromagnetic coil in FIG. 2a can be equivalent to the structure of the electromagnetic coil in FIG. 3, and the electromagnetic coil can have a polarity opposite to that of the magnet 11 when it is powered on, specifically, the polarity of the electromagnetic coil can be adjusted by adjusting direction of current flowing through the electromagnetic coil, so that the electromagnetic coil has a polarity opposite to that of the magnet 11. Wherein, the direction of current in the electromagnetic coil can be determined according to the Ampere's right-handed rule. Wherein, the number of the layers of the electromagnetic coil (that is, the number of the layers of the metal pattern of the electromagnetic coil) can be set in advance, and the set number should not be too large or too small, if it is too large, when the electromagnetic coil is formed at a position at the front side of the array substrate 13 corresponding to the magnet 11, or, is partly formed at a position at the front side of the array substrate 13 corresponding to the magnets 11 and partly formed at a position at the front side of the color filter substrate 14 corresponding to the magnets 11, a liquid crystal cell gap will be too large and if the set number of the layers of the electromagnetic coil is too small, the electromagnetic coil is apt to be open. Therefore, during setting the number of the layers of the electromagnetic coil, the above rule should be followed to avoid setting the number of the layers of the electromagnetic coil to be too large or too small, and then the number of the layers of the electromagnetic coil, which is suitable and can meet the function of the electromagnetic coil, is achieved.

In this embodiment, optionally, the magnet 11 can be adhered to the liquid crystal display panel 1 through a double-sided adhesive tape 100. In FIG. 1, the magnet 11 is adhered to the back side of the array substrate through a double-sided adhesive tape 100. Adhering the magnet 11 to the liquid crystal display panel 1 with the double-sided adhesive tape 100 can achieve more firm connection between the magnet 11 and the liquid crystal display panel 1.

In this embodiment, preferably, the magnet 11 is permanent soft magnet. The permanent soft magnets can serve as buffer medium, thus the permanent soft magnets provided between the liquid crystal display panel 1 and the mold frame 6 can serve a buffering function, so during test, the phenomenon that the liquid crystal display panel is seriously impacted to be damaged and in turn defect occurs when the display panel 1 and the mold frame 6 attract mutually can avoided, thus performance of the liquid crystal display device can be improved.

Optionally, the liquid crystal display device may further comprise a buffer pad 18 which is provided between the liquid crystal display panel 1 and the mold frame 6. Preferably, the buffer pad 18 can be adhered to the mold frame 6, the magnet 11, or both. The buffer pad 18 can serve a buffering function, so during test, the phenomenon that the liquid crystal display panel is seriously impacted to be damaged and in turn defect occurs when the display panel 1 and the mold frame 6 attract mutually can avoided. In addition, the buffer pad 18 can improve capability of the liquid crystal display panel to resist impact from outside, so as to increase performance of the liquid crystal display device.

Optionally, the liquid crystal display device may further comprise a fixing adhesive tape 19 located between the light guide plate 4 and the mold frame 6. The fixing adhesive tape 19 can press the light guide plate 4 after being assembled, and thus serves a function of fixing the light guide plate 4; furthermore, the fixing adhesive tape 19 can serve a function of preventing light leakage at the light incoming side of the light guide plate.

Optionally, the liquid crystal display device may further comprise polarizers 20 located at two sides of the liquid crystal display panel respectively, that is, the polarizers 20 are located at the back side of the color filter substrate and the back side of the array substrate respectively.

When the liquid crystal display panel and the backlight module need to be detached from each other, they can be detached from each other only by changing the magnetic field between the liquid crystal display panel and the mold frame. For example, for the liquid crystal display device in the first embodiment, in the operating state, the electromagnetic coil is not powered on and then will not generate a magnetic field, as the magnet 11 and the mold frame 6 have opposite polarities, the magnet 11 and the mold frame 6 attract each other, so that the liquid crystal display panel 1 is fixedly attached to the mold frame 6 through the magnet 11; when the liquid crystal display panel 1 and the mold frame 6 need to be detached from each other, the electromagnetic coil 12 is powered on during the detachment se that the electromagnetic coil 12 has a polarity opposite to that of the magnet 11 so that a repulsion force is generated between the electromagnetic coil 12 and the mold frame 6 which is larger than attraction force between the magnets 11 and the mold frame 6, and the mutually attracting magnet 11 and the mold frame 6 are separated under the effect of repulsion force between the electromagnetic coil 12 and the mold frame 6 and thus the liquid crystal display panel 1 and the mold frame 6 of the backlight module 2 are detached from each other. In addition, when the electromagnetic coil is powered on so as to generate a magnetic field, the direction of the magnetic field must be a direction which makes the electromagnetic coil 12 and the mold frame 6 repel each other, thus the winding direction of the electromagnetic coil 12 must keep consistent, so that the direction of the current flowing through the electromagnetic coil 12 when powered on keeps consistent, and then the electromagnetic coil 12 has a polarity opposite to that of the magnet 11.

Optionally, in the operating state, the electromagnetic coil 12 when powered on may also have a polarity which is the same as that of the magnet 11, so that attraction force is generated between the electromagnetic coil 12 and the mold frame 6, which enhances attraction force between the liquid crystal display panel 1 and the mold frame 6 so that a more firm fixed attachment between the liquid crystal display panel 1 an the mold frame 6 is achieved.

Optionally, in this embodiment, when the electromagnetic coil 12 is formed both at a position on the array substrate corresponding to the magnet 11 and at the position on the color filter substrate corresponding to the magnet 11, it is required to connect the metal pattern formed at the position on the array substrate corresponding to the magnet 11 and the metal pattern formed at the position on the color filter substrate corresponding to the magnet 11. Specifically, the electromagnetic coil 12 is partly formed at a position at the front side of the array substrate corresponding to the magnets 11 and partly formed at a position at the front side of the color filter substrate corresponding to the magnets 11, the uppermost layer in the structure of the electromagnetic coil 12 in the array substrate is the passivation layer which is provided with a via hole in which the metal pattern is filled; the uppermost layer in the structure of the electromagnetic coil 12 in the color filter substrate is the passivation layer which is provided with a via hole in which the metal pattern is filled, and the via hole in the color filter substrate corresponds to that in the array substrate. When the array substrate is assembled with the color filter substrate, the metal pattern in the via hole in the array substrate contacts that in the via hole in the color filter substrate, thus connection between the metal pattern in the array substrate and the metal pattern in the color filter substrate is achieved. At this moment, the lowermost layer of metal pattern in the array substrate and the lowermost layer of metal pattern in the color filter substrate are respectively connected with two electrodes of the power supply through leads to form the electromagnetic coil 12.

In the liquid crystal display device provided by this embodiment, the liquid crystal display panel 1 and the mold frame 6 of the backlight module 2 are attached to each other or detached from each other by the magnetic device, and then the problem of being unable to detach the liquid crystal display panel from the backlight module when they are fixed with the double-sided adhesive is avoided, thus the frameless effect of the liquid crystal display device can be achieved. When the liquid crystal display panel 1 and the backlight module 2 need to be detached from each other, it is only required to change the direction of the magnetic field between the liquid crystal display panel 1 and the mold frame 6, and then the problem of being unable to detach the liquid crystal display panel from the backlight module 2 when they are fixed with the double-sided adhesive is avoided, so that it is easy to rework the liquid crystal display device having defect, preventing the situation that the liquid crystal display device with defect is abandoned due to the detachment from occurring.

A second embodiment of the present invention provides a liquid crystal display device, which is different from that provided in the first embodiment in that:

the magnetic device only comprises the magnetic force adjustable member for adjusting the magnetic field to achieve attachment and detachment between the liquid crystal display panel and the mold frame.

Preferably, the magnetic force adjustable member comprises an electromagnetic coil formed at a corresponding position on the liquid crystal display panel, wherein, when the electromagnetic coil is powered on, it generates a magnetic field which further generates magnetic force to make the liquid crystal display panel and the mold frame attract mutually; and when the electromagnetic coil is powered off, it stops generating the magnetic field so that the liquid crystal display panel and the mold frame may be separated from each other.

Preferably, a polarity at the position on the mold frame corresponding to the electromagnetic coil is opposite to that generated when the electromagnetic coil is powered on, or a metal sheet, which can be attracted by the magnetic field generated when the electromagnetic coil is powered on, is provided at the position on the mold frame corresponding to the electromagnetic coil.

It can be seen that, when the electromagnetic coil is powered on, the liquid crystal display panel and the mold frame attract mutually as they have opposite polarities, and thus the fixed attachment between the liquid crystal display panel and the mold frame is achieved. When the liquid crystal display panel and the mold frame need to be detached from each other, current stops to be applied to the electromagnetic coil so that the electromagnetic coil does not generate the magnetic field and then does not have polarity, and then the liquid crystal display panel and the mold frame do not attract mutually, so as to achieve detachment of the liquid crystal display panel from the mold frame. Alternatively, in this embodiment, when the liquid crystal display panel and the mold frame need to be detached from each other, a reverse current with respect to that in the operating state can be applied to the electromagnetic coil, at this moment, the electromagnetic coil has a polarity opposite to that in the operating state, and thus the liquid crystal display panel and the mold frame may be easily detached from each other.

Optionally, the liquid crystal display device may further comprise a buffer pad which is provided between the liquid crystal display panel and the mold frame. Preferably, the buffer pad can be adhered to the mold frame or the liquid crystal display panel. The buffer pad can serve the buffering function, so during test, the phenomenon that the liquid crystal display panel is seriously impacted to be damaged and in turn defect occurs when the display panel 1 and the mold frame 6 attract mutually can avoided. In addition, the buffer pad 18 can increase capability of the liquid crystal display panel to resist impact from outside, to increase performance of the liquid crystal display device.

The other structures and functions of the liquid crystal display device in this embodiment are the same as those in the first embodiment.

The third embodiment of the present invention provides a liquid crystal d device, which is different from that in the first embodiment in that:

the magnet of the magnetic device is fixedly connected with the mold frame and provided between the liquid crystal display panel and the mold frame, and the magnet attracts the liquid crystal display panel through the magnetic field they generate so that the liquid crystal display panel is fixedly attached to the mold frame through the magnets.

Preferably, the back side of the liquid crystal display panel (the light incoming surface of the liquid crystal display panel) has a polarity opposite to that of the magnet, at a position corresponding to the magnet, thus the mutual attraction between the liquid crystal display panel and the magnet is achieved. During actual production, the back side of the liquid crystal display panel can be magnetized at the position corresponding to the magnet, so that the back side of the liquid crystal display panel has a polarity opposite to that of the magnet, at the position corresponding to the magnet.

Also, in this embodiment, the electromagnetic coil of the magnetic device has polarity being the same as that of the magnet when it is powered on, and the repulsion force between the electromagnetic coil and the magnets is larger than the attraction force between the magnet and the back side of the liquid crystal display panel, thus the mutual repulsion between the electromagnetic coil and the magnet is achieved to detach the mutually attracting magnets and liquid crystal display panel from each other and then detach the mold frame and the liquid crystal display panel from each other.

In this embodiment, optionally, the magnet 11 is adhered to the surface of the mold frame 6 through a double-sided adhesive tape 102.

The electromagnetic coil is not powered on when the liquid crystal display device is in operating state, at this moment, the electromagnetic coil does not generate the magnetic field, as the magnet and the back side of the liquid crystal display panel have opposite polarities, the magnet and the back side of the liquid crystal display panel attract mutually, so that the liquid crystal display panel is fixedly attached with the mold frame through the magnet; when the liquid crystal display panel and the mold frame need to be detached from each other, the electromagnetic coil is powered on so that the electromagnetic coil has polarity being the same as that of the magnet, thus a repulsion force, which is larger than the attraction force between the magnet and the back side of the liquid crystal display panel, is generated between the electromagnetic coil and the magnet, then the mutually attracting magnet and liquid crystal display panel are detached from each other under the effect of the repulsion force between the electromagnetic coil and the magnet, and then the liquid crystal display panel and the mold frame of the backlight module are detached from each other. In addition, when the electromagnetic coil is powered on so as to generate a magnetic field, the direction of the magnetic field must be a direction which makes the electromagnetic coil and the magnet repel mutually, thus the winding direction of the electromagnetic coil must keep consistent, so that the direction of the current flowing through the electromagnetic coil when powered on keeps consistent, and then the electromagnetic coil has a polarity which is the same as that of the magnets.

Optionally, in the operating state, when powered on, the electromagnetic coil may also have a polarity which is opposite to that of the magnet, so that an attraction force is generated between the electromagnetic coil and the magnet, and the attraction force between the back side of the liquid crystal display panel and the mold frame is enhanced so that a more firm fixed attachment between the liquid crystal display panel and the mold frame is achieved.

The other structures and functions of the liquid crystal display device in this embodiment are the same as those in the first embodiment.

The fourth embodiment of the present invention provides a liquid crystal display device, which is different from that of the first embodiment in that:

the magnet of the magnetic device are fixedly attached with the mold frame and provided between the liquid crystal display panel and the mold frame, and the magnet attracts the liquid crystal display panel through the magnetic field it generates so that the liquid crystal display panel is fixedly attached with the mold frame through the magnet.

Preferably, the back side of the liquid crystal display panel (the light incoming surface of the liquid crystal display panel) is provided with a metal sheet which can be attracted by the magnet, at a position corresponding to the magnet, thus the mutual attraction between the liquid crystal display panel and the magnet is achieved.

Also, in this embodiment, the electromagnetic coil of the magnetic device has a polarity being the same as that of the magnet when it is powered on, and the repulsion force between the electromagnetic coil and the magnets is larger than the attraction force between the magnet and the back side of the liquid crystal display panel, thus the mutual repulsion between the electromagnetic coil and the magnet is achieved to detach the mutually attracting magnet and liquid crystal display panel from each other and then detach the mold frame and the liquid crystal display panel from each other.

In this embodiment, optionally, the magnet are adhered to the surface of the mold frame through a double-sided adhesive tape.

The electromagnetic coil is not powered on when the liquid crystal display device is in the operating state. At this moment, the electromagnetic coil does not generate the magnetic field, and as the magnet and the back side of the liquid crystal display panel have opposite polarities, the magnet and the back side of the liquid crystal display panel attract mutually, so that the liquid crystal display panel is fixedly attached to the mold frame through the magnet; when the liquid crystal display panel and the mold frame need to be detached from each other, the electromagnetic coil is powered on so that the electromagnetic coil has a polarity which is the same as that of the magnet and the repulsion force between the electromagnetic coil and the magnet is larger than the attraction force between the magnet and the back side of the liquid crystal display panel, then the mutually attracting magnet and liquid crystal display panel are detached from each other under the effect of the repulsion force between the electromagnetic coil and the magnet, and thus detachment of the liquid crystal display panel from the mold frame of the backlight module is achieved. In addition, when the electromagnetic coil is powered on to generate a magnetic field, the direction of the magnetic field must be a direction which makes the electromagnetic coil and the magnets repel mutually, thus the winding direction of the electromagnetic coil must keep consistent, so that the direction of the current flowing through the electromagnetic coil when powered on keeps consistent, and then the electromagnetic coil has a polarity which is the same as that of the magnet.

Optionally, in the operating state, the electromagnetic coil when powered on may also have polarity which is opposite to that of the magnets, so that an attraction force is generated between the electromagnetic coil and the magnets to enhance the attraction force between the back side of the liquid crystal display panel and the mold frame, thereby a more firm fixed attachment between the liquid crystal display panel and the mold frame is achieved.

The other structures and functions of the liquid crystal display device in this embodiment are the same as those in the first embodiment.

In this embodiment, the electromagnetic coil may also be provided at the back side of the liquid crystal display panel, and the mold frame is provided with the metal sheet which can effectuate mutual attraction with the magnet, at a position corresponding to the magnet, thus the technical effect which is the same as in this embodiment can also be achieved.

Figure 4A:
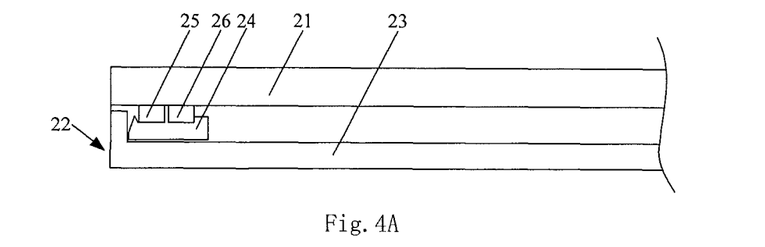
FIG. 4A is a partially sectional view of structure of a display device provided by a fifth embodiment of the present invention.
Figure 4B:
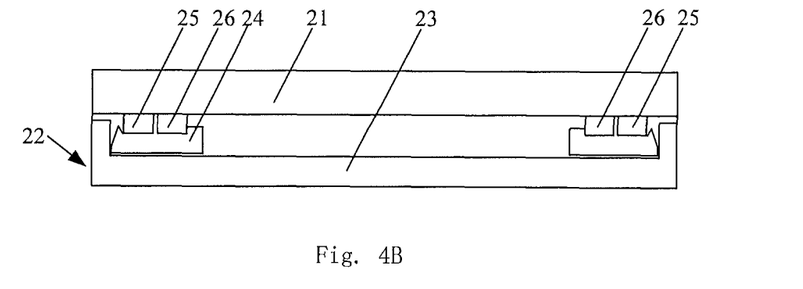
FIG. 4B is a sectional view of structure of a display device provided by the fifth embodiment of the present invention.

FIG. 4A is a partially sectional view of structure of a display device provided by the fifth embodiment of the present invention, and FIG. 4B is a sectional view of structure of a display device provided by a fifth embodiment of the present invention. As shown in FIG.4A and FIG.4B, the display device comprises a display panel 21 and a module 22 at the back side of the display panel 21, and the module 22 comprises a back plate 23 and a mold frame 24 which is provided between the back plate 23 and the display panel 21, the mold frame 24 is fixedly connected with the back plate 23, and the display panel 21 and the mold frame 24 are attached to each other or detached from each other through a magnetic device.

Preferably, in this embodiment, the display device is an organic light-emitting diode (OLED for short) display device, and the display panel 21 is an OLED display panel.

In this embodiment, preferably, the magnetic device comprises one or more magnets 25 which are fixedly attached to the display panel 21 and provided between the display panel 21 and the mold frame 24, and the one or more magnets 25 attract the mold frame 24 through a magnetic force generated from the magnetic field thereof so that the display panel 21 is fixedly attached to the mold frame 24 through the one or more magnets 25. Optionally, the mold frame 24 is provided with other magnets having polarities opposite to those of the magnets 25 at positions corresponding to the magnets 25. Wherein, the magnets 25 are permanent magnets which can be permanent ferromagnets.

Preferably, polarities at positions on the surface of the mold frame 24 corresponding to the magnets 25 are opposite to that of the magnets 25, preferably, at least a part of the mold frame 24 corresponding to the magnets 25 is made of metal. Thus, mutual attraction between the mold frame 24 and the magnets 25 is achieved. During actual production, the surface of the mold frame 24 can be magnetized at positions corresponding to the magnets 25, so that polarities at positions on the surface of the mold frame 24 corresponding to the magnets 25 are opposite to that of the magnets 25.

In this embodiment, preferably, the magnets 25 are permanent soft magnets. The permanent soft magnets can serve as buffer mediums, thus the permanent soft magnets provided between the display panel 21 and the mold frame 24 can serve the function of buffering, and the phenomenon that the display panel of the display device is destroyed and defect occurs during test can be avoided, thus performance of the display device is improved.

In this embodiment, the magnetic device may comprise at least one magnetic force adjustable member for adjusting the magnetic field to detach the display panel from the mold frame.

Preferably, the magnetic force adjustable member may comprise an electromagnetic coil formed at a position on the display panel 21 corresponding to the magnets, and the electromagnetic coil has polarity opposite to that of the magnets when it is powered on, thus the mutual repulsion between the electromagnetic coil and the mold frame is achieved, and the repulsion force between the electromagnetic coil and the mold frame is larger than the attraction force between the magnets and the mold frame so as to detach the mutually attracting magnets and mold frame from each other. The electromagnetic coil is not specifically shown in the Figure.

Optionally, the display device may further comprise a buffer pad 26 which is provided between the display panel 21 and the mold frame 24. Preferably, the buffer pad 26 can be adhered to the mold frame 24 or the magnets 25, or to both of the mold frame 24 and the magnets 25. The buffer pad 26 can serve the buffering function, which may avoid the phenomenon that the display panel is seriously impacted to be destroyed and then defect occurs when the display panel and the mold frame attract mutually during test. In addition, the buffer pad 26 can improve the impact resistance of the OLED display panel against the outside, thus performance of the display device is improved.

In the display device provided by this embodiment, the display panel and the mold frame of the module are attached to each other or detached from each other through the magnetic device, and then the problem of being unable to detach the display panel from the module when they are fixed with the double-sided adhesive is avoided, thus achieving the frameless effect of the display device and facilitating subsequent maintenance. When the display panel and the module need to be detached from each other, it is only required to change the magnetic field between the OLED display panel and the mold frame, and then the problem of being unable to detach the display panel from the module when they are fixed with the double-sided adhesive is avoided, so it is easy to rework the display device having defect, preventing the situation that the display device with defect is abandoned due to the detachment from occurring.

The sixth embodiment of the present invention provides an OLED display device, which is different from that in the fifth embodiment in that:

the magnetic device only comprises the magnetic force adjustable device for adjusting the magnetic field to achieve attachment and detachment between the OLED display panel and the mold frame.

Preferably, the magnetic force adjustable member comprises an electromagnetic coil formed at a corresponding position on the OLED display panel, wherein, when the electromagnetic coil is powered on, it generates a magnetic field, which further generates a magnetic force to effectuate the attraction between the OLED display panel and the mold frame; when the electromagnetic coil is powered off, it stops generating the magnetic force to separate the OLED display panel from the mold frame.

Preferably, when the electromagnetic coil is located on the OLED display panel, the mold frame has a polarity opposite to that of the electromagnetic coil when powered on at the position corresponding to the electromagnetic coil; or the mold frame is provided with a metal sheet which can be attracted by the magnetic force generated when the electromagnetic coil is powered on at the position corresponding to the electromagnetic coil.

Therefore, when the electromagnetic coil is powered on, the OLED display panel and the mold frame attract each other as they have opposite polarities, and thus the fixed connection between the OLED display panel and the mold frame is achieved. When the OLED display panel and the mold frame need to be detached from each other, current stops to be applied to the electromagnetic coil so that the electromagnetic coil does not generate the magnetic field and then does not have polarity, so the OLED display panel and the mold frame do not attract each other, and thereby the OLED display panel and the mold frame are detached from each other. Alternatively, in this embodiment, when the OLED display panel and the mold frame need to be detached from each other, a reverse current with respect to that in the operating state can be applied to the electromagnetic coil, and at this moment, the electromagnetic coil has a polarity opposite to that in the operating state, thus the OLED display panel and the mold frame can be easily detached from each other.

The other structures and functions of the OLED display device in this embodiment are the same as those in the fifth embodiment.

The seventh embodiment of the present invention provides an OLED display device, which is different from that in the fifth embodiment in that:

the magnets of the magnetic device are fixedly connected with the mold frame and provided between the OLED display panel and the mold frame, and the magnets attract the OLED display panel through the magnetic field they generate so that the OLED display panel is fixedly attached to the mold frame through the magnets.

Preferably, the back side of the OLED display panel (i.e. the surface close to the mold frame) has a polarity opposite to that of the magnets at positions corresponding to the magnets, thus the mutual attraction between the OLED display panel and the magnets is achieved. During actual production, the back side of the OLED display panel can be magnetized at positions corresponding to the magnets, so that polarities at positions on the back side of the OLED display panel corresponding to the magnets are opposite to that of the magnets.

Also, in this embodiment, the electromagnetic coils of the magnetic device corresponding to the magnets have polarities being the same as that of the magnets when they are powered on, and the repulsion force generated by the electromagnetic coils between the back side of the OLED display panel and the magnets is larger than the attraction force between the magnets and the back side of the OLED display panel, thus the mutual repulsion between the electromagnetic coils and the magnets is achieved to detach the mutually attracting magnets and OLED display panel from each other and then detach the mold frame from the OLED display panel.

In this embodiment, optionally, the magnets are adhered to the surface of the mold frame through a double-sided adhesive tape.

The electromagnetic coils are not powered on when the OLED display device is in the operating state, and at this moment, the electromagnetic coils do not generate the magnetic field, as the magnets and the back side of the OLED display panel have opposite polarities, the magnets and the back side of the OLED display panel attract each other, so that the OLED display panel is fixedly attached to the mold frame through the magnets; when the OLED display panel and the mold frame need to be detached from each other, the electromagnetic coils are powered on so that the electromagnetic coils have polarities being the same as those of the magnets and the repulsion force between the electromagnetic coils and the magnets is larger than the attraction force between the magnets and the back side of the OLED display panel, then the mutually attracting magnets and OLED display panel are detached from each other under the effect of the repulsion force between the electromagnetic coils and the magnets, and thus the OLED display panel and the mold frame of the backlight module are detached from each other. In addition, when the electromagnetic coils are powered on to generate a magnetic field, the direction of the magnetic field must be a direction which makes the electromagnetic coils and the magnets repel each other, thus the winding direction of a electromagnetic coil must keep consistent, so that direction of the current flowing through the electromagnetic coil when powered on keeps consistent, and then the electromagnetic coil has polarity which is the same as that of the magnets.

Optionally, in the operating state, the electromagnetic coils when powered on may also have polarities which are opposite to those of the magnets, so that an attraction force is generated between the electromagnetic coils and the magnets, which enhance the attraction force between the back side of the OLED display panel and the mold frame so that a more firm fixed connection between the OLED display panel and the mold frame is achieved.

The other structures and functions of the OLED display device in this embodiment are the same as those in the fifth embodiment.

The eighth embodiment of the present invention provides an OLED display device, which is different from that in the fifth embodiment in that:

the magnets in the magnetic device are fixedly attached to the mold frame and provided between the OLED display panel and the mold frame, and the magnets attract the OLED display panel through the magnetic field they generate so that the OLED display panel is fixedly attached to the mold frame through the magnets.

Preferably, the back side of the OLED display panel (i.e. the surface close to the mold frame) is provided with metal sheets which can be attracted by the magnets, at the positions corresponding to the magnets, thus the mutual attraction between the OLED display panel and the magnets is achieved.

Also, in this embodiment, a electromagnetic coil of the magnetic device corresponding to one magnet has polarity being the same as that of the magnet when it is powered on, and the repulsion force between the electromagnetic coil and the magnet is larger than the attraction force between the magnet and the back side of the OLED display panel, thus the mutual repulsion between the electromagnetic coil and the magnet is achieved so as to detach the mutually attracting magnets and OLED display panel from each other and then detach the mold frame from the OLED display panel.

In this embodiment, optionally, the magnets are adhered to the surface of the mold frame through a double-sided adhesive tape.

The electromagnetic coils are not powered on when the OLED display device is in the operating state, and at this moment, the electromagnetic coils do not generate the magnetic field, as the magnets and the back side of the OLED display panel have opposite polarities, the magnets and the back side of the OLED display panel attract each other, so that the OLED display panel is fixedly attached to the mold frame through the magnets; when the OLED display panel and the mold frame need to be detached from each other, the electromagnetic coils are powered on so that the electromagnetic coils have polarities being the same as that of the magnets and the repulsion force between the electromagnetic coils and the magnets is larger than the attraction force between the magnets and the back side of the OLED display panel, then the mutually attracting magnets and OLED display panel are detached from each other under the effect of the repulsion force between the electromagnetic coils and the magnets, and then the OLED display panel and the mold frame of the backlight module are detached from each other. In addition, when the electromagnetic coils are powered on to generate a magnetic field, the direction of the magnetic field must be a direction which makes the electromagnetic coils and the magnets repel each other, thus the winding direction of the electromagnetic coil must keep consistent, so that direction of the current flowing through the electromagnetic coils when powered on keeps consistent, and then the electromagnetic coils has polarity which is the same as that of the magnets.

Optionally, in the operating state, the electromagnetic coils when powered on may also have polarities which are opposite to those of the magnets, so that an attraction force is generated between the electromagnetic coil and the magnets, which enhances the attraction force between the back side of the OLED display panel and the mold frame so that a more firm fixed attachment between the OLED display panel and the mold frame is achieved.

The other structures and functions of the OLED display device in this embodiment are all the same as those in the fifth embodiment.

In this embodiment, the electromagnetic coils may also be provided at the back side of the OLED display panel and the mold frame is provided with the metal sheets can effectuate mutual attraction with the magnets at positions corresponding to the magnets, thus the technical effect which is the same as in this embodiment can also be achieved.

Figure 5:
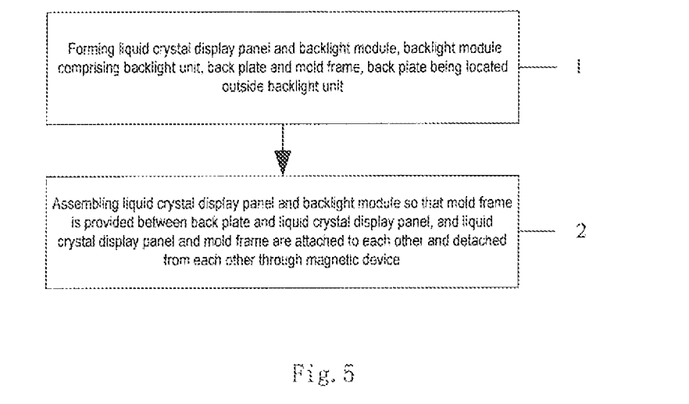
FIG. 5 is a flow chart of a method for fabricating a liquid crystal display device provided by the ninth embodiment of the present invention.

FIG. 5 is a flow chart of a method for fabricating a liquid crystal display device provided by the ninth embodiment of the present invention, as shown in FIG. 5, the method comprises:

Step 1, forming a liquid crystal display panel and a backlight module, the backlight module comprises a backlight unit, a back plate and a mold frame, and the back plate is located outside the backlight unit.

Wherein, the backlight unit can comprise a light source and a light guide plate. The back plate is located outside the light source and the light guide plate.

Wherein, the liquid crystal display panel comprises an array substrate and a color filter substrate arranged opposite to each other, then forming the liquid crystal display panel comprises assembling the array substrate and the color filter substrate.

Step 2, the liquid crystal display panel and the backlight module are assembled so that the mold frame is provided between the back plate and the liquid crystal display panel, and the liquid crystal display panel and the mold frame are attached to each other and detached from each other through the magnetic device.

Preferably, the magnetic device comprises one or more magnets which can be provided between the liquid crystal display panel and the backlight module and fixedly attached to the liquid crystal display panel.

Preferably, the liquid crystal display panel may comprise one or more electromagnetic coil formed at a position on the liquid crystal display panel corresponding to the magnets, and the electromagnetic coils have polarities opposite to those of the magnet when it is powered on, and the repulsion force between the electromagnetic coils and the mold frame is larger than the attraction force between the magnets and the mold frame, thus the mutually attracting magnets and mold frame are detached from each other. The position on the liquid crystal display panel corresponding to one magnet comprises: the position on the array substrate corresponding to the magnet and/or the position on the color filter substrate corresponding to the magnet.

The method for fabricating a liquid crystal display device provided by the present invention can be used to fabricate the liquid crystal display device provided by the above first embodiment.

In the liquid crystal display device fabricated by the method for fabricating a liquid crystal display device provided by this embodiment, the liquid crystal display panel and the mold frame in the backlight module are attached to each other or detached from each other through the magnetic device, and then the problem of being unable to detach the liquid crystal display panel from the backlight module when they are fixed with the double-sided adhesive is avoided, achieving the frameless effect of the liquid crystal display device, and facilitating subsequent maintenance. When the liquid crystal display panel and the backlight module need to be detached from each other, it is only required to change the magnetic field between the liquid crystal display panel and the mold frame, and then the problem of being unable to detach the liquid crystal display panel from the backlight module when they are fixed with the double-sided adhesive is avoided, so that it is easy to rework the liquid crystal display device with defect, thus preventing the situation that the liquid crystal display device with defect is abandoned due to the detachment from occurring.

Figure 6:
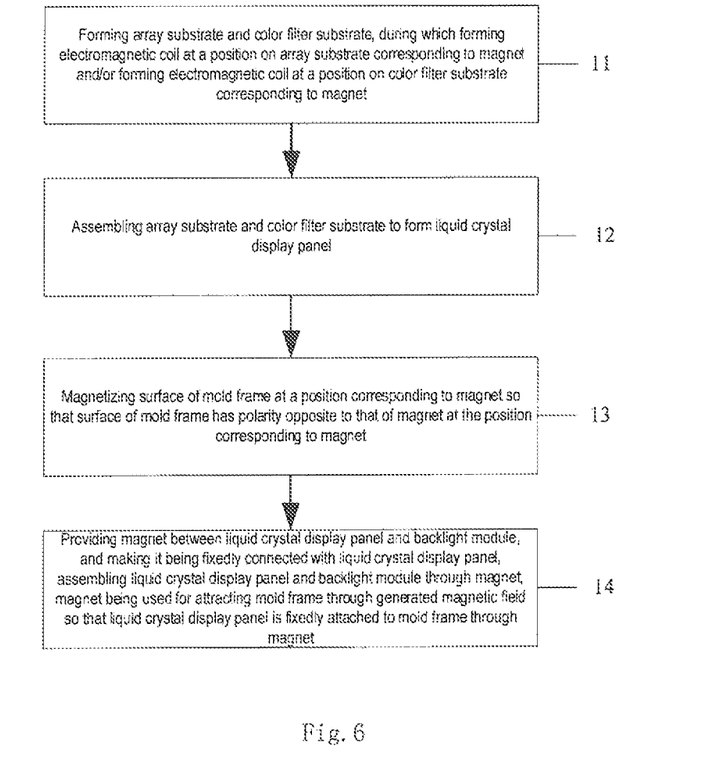
FIG. 6 is a flow chart of a method for fabricating a liquid crystal display device provided by a tenth embodiment of the present invention.

FIG. 6 is a flow chart of a method for fabricating a liquid crystal display device provided by the tenth embodiment of the present invention, as shown in FIG. 6, the method comprises:

step 11, forming an array substrate and a color filter substrate, when forming the array substrate and the color filter substrate, forming the electromagnetic coils at predetermined positions on the array substrate (that is, positions on the array substrate corresponding to those to be formed magnets and/or at predetermined positions on the color filter substrate corresponding to above magnets.

Hereinafter, one electromagnetic coil and one magnet corresponding to the one electromagnetic coil will be described as an example.

Optionally, forming the electromagnetic coil at a position the array substrate corresponding to the magnet comprises:

step 111, alternately forming metal pattern and passivation layer at the position on the array substrate corresponding to the magnet according to the number of alternate periods, and in each alternate period, a layer of metal pattern is formed on a passivation layer, and two adjacent layers of metal pattern are interconnected through a via hole formed in the passivation layer therebetween.

For example, step 111 specifically comprises:

step 1111, forming the passivation layer at a position on the array substrate corresponding to the magnet, providing a via hole in the passivation layer, forming the metal pattern on the passivation layer with a via hole provided therein, and filling the via hole with the metal pattern so that two adjacent layers of metal pattern are interconnected through the via hole.

Specifically, the passivation layer and the metal pattern can be formed through a patterning process, and a passivation layer mask plate is required when forming the passivation layer using the patterning process and a metal pattern mask plate is required during forming the metal pattern using the patterning process. Wherein, the passivation layer mask plate may be a mask plate obtained by making it on the mask plate of the original array substrate, that is, adding a passivation layer forming structure at a position in the peripheral area of the mask plate of the original array substrate corresponding to the magnet, and the passivation layer forming structure is used to form the passivation layer; the metal pattern mask plate may be a mask plate obtained by making improvements on the mask plate of the original array substrate, that is, adding a coil forming structure at a position in the peripheral area of the mask plate of the original array substrate corresponding to the magnet, and the coil forming structure is used to form the metal pattern. It should be noted that, since the metal pattern and the passivation layer in the electromagnetic coil are usually multi-layered, the passivation layer mask plate may comprise a mask plate obtained by making improvements on a plurality of mask plates of the original array substrate, and the metal pattern mask plate may comprise a mask plate obtained by making improvements on a plurality of mask plates of the original array substrate. Alternatively, the passivation layer mask plate may also be a mask plate separately added to form the passivation layer, and the passivation layer forming structure is formed at a position on the passivation layer mask plate corresponding to the magnet and is used to form the passivation layer; the metal pattern mask plate may also be a mask plate separately added to form the metal pattern, and the coil forming structure is formed at a position on the metal pattern mask plate corresponding to the magnet and is used to form the metal pattern. The above mask plate structures obtained by making improvements on the mask plate of the original array substrate are complex, which will result in multiple process defects, therefore, in this embodiment, it is preferable to additionally provide a mask plate, the structure of which is simple, thus avoiding multiple process defects.

Step 1112, repeating the step 1111 n−1 times, wherein, n is the number of alternate periods.

Figure 2B:
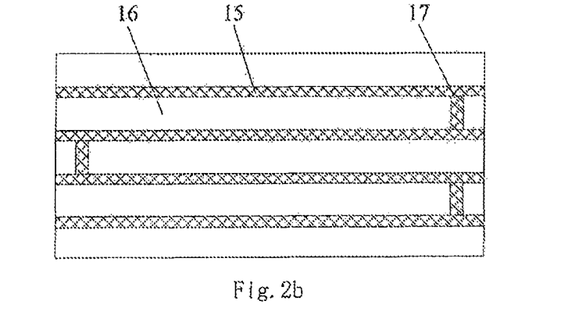
FIG. 2b is a schematic diagram of structure of another electromagnetic coil in FIG. 1.
Figure 3:
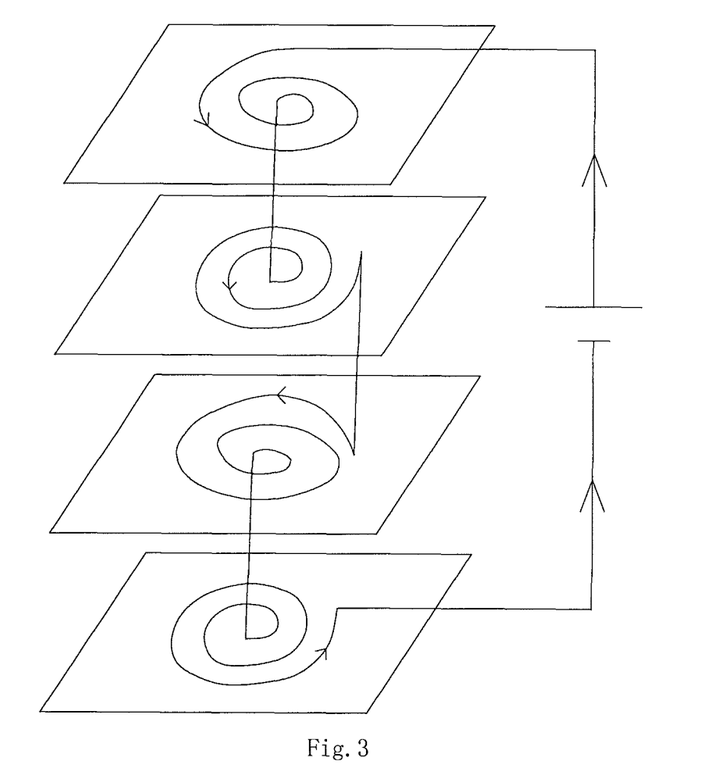
FIG. 3 is an equivalent schematic diagram of the electromagnetic coil in FIGS. 2a and 2b.

Furthermore, after step 1112, the method may further include a step of forming the passivation layer, and the schematic diagram of the resultant electromagnetic coil is illustrated in FIG. 2a or FIG. 2b for reference.

Step 112, the metal pattern in the first alternate period and the metal pattern in the last alternate period are respectively connected to two electrodes of the power supply by leads to form the electromagnetic coil.

Optionally, forming the electromagnetic coil at a position on the color filter substrate corresponding to the magnet comprises:

Step 113, alternately forming the metal pattern and the passivation layer at the position on the color filter substrate corresponding to the magnet according to the number of alternate periods, and in each alternate period the metal pattern is formed on the passivation layer and two adjacent layers of metal pattern are interconnected through the via hole formed in the passivation layer.

For example, step 113 specifically comprises:

Step 1131, forming the passivation layer at a position on the color filter substrate corresponding to the magnet, providing a via hole in the passivation layer, forming the metal pattern on the passivation layer with the via hole provided therein, and filling the via hole with the metal pattern so that two adjacent layers of metal pattern are interconnected through the via hole.

Specifically, the passivation layer and the metal pattern can be formed through a patterning process, and a passivation layer mask plate is required during forming the passivation layer using the patterning process and a metal pattern mask plate is required during forming the metal pattern using the patterning process. Wherein, the passivation layer mask plate may be a mask plate obtained by making improvements on the mask plate of the original color filter substrate, that is, adding a passivation layer forming structure at a position in the peripheral area of the mask plate of the original color filter substrate corresponding to the magnet, and the passivation layer forming structure is used to form the passivation layer; the metal pattern mask plate may be a mask plate obtained by making improvements on the mask plate of the original color filter substrate, that is, adding a coil forming structure at a position in the peripheral area of the mask plate of the original color filter substrate corresponding to the magnet, and the coil forming structure is used to form the passivation layer and the metal pattern. It should be noted that, since the metal pattern and the passivation layer in the electromagnetic coil are usually multilayered, the passivation layer mask plate may comprise a mask plate obtained by making improvements on a plurality of mask plates of the original color filter substrate, and the metal pattern mask plate may comprise a mask plate obtained by making improvements on a plurality of mask plates of the original color filter substrate. Alternatively, the passivation layer mask plate may also be a mask plate separately added to form the passivation layer, and the passivation layer forming structure is formed at a position on the passivation layer mask plate corresponding to the magnet and is used to form the passivation layer; the metal pattern mask plate may also be a mask plate separately added to form the metal pattern, and the coil forming structure is formed at a position on the metal pattern mask plate corresponding to the magnet and is used to form the metal pattern. The above mask plate structures obtained by making improvements on the mask plates of the original color filter substrate are complex, which will result in multiple process defects, therefore, in this embodiment, it is preferable to separately provide a mask plate, the structure of which is simple, thus avoiding the multiple process defects.

Step 1132, repeating the step 1131 n−1 times, wherein, n is the number of alternate periods.

Furthermore, after step 1132, the method may further include a step of forming the passivation layer, and the schematic diagram of the resultant electromagnetic coil is illustrated in FIG. 2a or FIG. 2b for reference.

Step 114, the metal pattern in the first alternate period and the metal pattern in the last alternate period are respectively connected to two electrodes of the power supply through leads to form the electromagnetic coil.

Step 12, assembling the array substrate and the color filter substrate to form th liquid crystal display panel.

Step 13, magnetizing the surface of the mold frame so that the surface of the mold frame has polarity. Preferably, a magnet is provided at a predetermined position on the mold frame, or a metal sheet that can be attracted by a magnet is provided at a predetermined position on the mold frame.

Step 14, providing a magnet between the liquid crystal display panel and the backlight module, the magnet is fixedly attached to the liquid crystal display panel, the position of the magnet faces the position for the position where the magnet or the metal sheet that can be attracted by a magnet is provided) on the surface of the mold frame that has been magnetized, and polarity of the magnet is opposite to that on the surface of the mold frame, the liquid crystal display panel and the backlight module are assembled through the magnet, and the magnet attracts the mold frame through the magnetic field it generates so that the liquid crystal display panel is fixedly attached to the mold frame through the magnet; the backlight module comprises a light source, a light guide plate, a back plate and a mold frame, and the back plate is located outside the light source and the light guide plate.

Specifically, the surface of the mold frame has polarity opposite to that of the magnet, at the position corresponding to the magnet, thus the mutual attraction between the mold frame and the magnet is achieved; the electromagnetic coil in the operating state is not powered on and then does not generate magnetic field, as the magnet and the mold frame have opposite polarities, the magnet and the mold frame attract each other so that the liquid crystal display panel is fixedly attached to the mold frame through the magnet. When the liquid crystal display panel and the mold frame need to be detached from each other, the electromagnetic coil is powered on during the detachment so that the electromagnetic coil when powered on has polarity opposite to that of the magnet and the repulsion force between the electromagnetic coil and the mold frame is larger than the attraction force between the magnet and the mold frame, then the mutually attracting magnet and mold frame are detached from each other under the effect of the repulsion force between the electromagnetic coil and the mold frame, and thus detachment the liquid crystal display panel from the mold frame of the backlight module is achieved.

In the liquid crystal display device fabricated by the method for fabricating a liquid crystal display device provided by this embodiment, the liquid crystal display panel and the mold frame in the backlight module are attached to each other or detached from each other through the magnetic device, and then the problem of being unable to detach the liquid crystal display panel from the backlight module when they are fixed with the double-sided adhesive is avoided, thus achieving the frameless effect of the liquid crystal display device, and facilitating subsequent maintenance. When the liquid crystal display panel and the backlight module need to be detached from each other, it is only required to change the magnetic field between the liquid crystal display panel and the mold frame, and then the problem of being unable to detach the liquid crystal display panel from the backlight module when they are fixed with the double-sided adhesive is avoided, so that the liquid crystal display device with defect can be reworked, thus preventing the situation that the liquid crystal display device with defect is abandoned due to the detachment from occurring.

In the above embodiments, description is made by taking the method for fabricating a liquid crystal display device as an example, but these embodiments are also applicable to the OLED display device.

It can be understood that the above embodiments are only exemplary embodiments used for describing the principles of the present invention, and however the present invention is not limited thereto. For persons skilled in the art, various variations and improvements can be made without departing from the spirit and the substance of the present invention, and such variations and improvements shall be deemed to be within the protection scope of the present invention.

What is claimed is:

1. A display device, comprising: a display panel and a module at the back side of the display panel, the module comprising a back plate and a mold frame, wherein, the mold frame is provided between the back plate and the display panel, wherein,
   the display device further comprises a magnetic device, and the display panel and the mold frame are attached to each other and detached from each other through the magnetic device,
   wherein the magnetic device comprises a magnetic force adjustable member for adjusting attraction between the display panel and the mold frame,
   wherein the magnetic force adjustable member comprises one or more electromagnetic coils formed at corresponding positions on the display panel, wherein,
   when the electromagnetic coils are powered on, they generate magnetic force to allow the display panel and the mold frame to attract mutually; and
   when the electromagnetic coils are powered off, they stop generating magnetic force to allow the display panel and the mold frame to separate from each other,
   wherein each of the electromagnetic coils comprises a plurality of layers of metal pattern, a passivation layer is formed between two adjacent layers of metal pattern, two adjacent layers of metal pattern are interconnected through a via hole formed in the passivation layer, and among the plurality of layers of metal pattern, a first layer of metal pattern and a last layer of metal pattern are connected with two electrodes of a power supply through leads respectively,
   wherein the display panel is a liquid crystal display panel which comprises a first substrate and a second substrate arranged opposite to each other,
   wherein the plurality of layers of metal pattern are formed in the first substrate and/or the second substrate, and
   wherein the magnetic device comprises one or more magnets which are fixedly attached to the display panel, overlapping with the plurality of layers of metal pattern of the electromagnetic coils and provided between the display panel and the mold frame, and the magnets are attracted to the mold frame through a magnetic field they generate so that the display panel is fixedly attached to the mold frame through the magnets.

2. The display device according to claim 1, wherein the mold frame has polarity opposite to that of the magnets, at positions corresponding to the magnets, or the mold frame is provided with metal sheets which can be attracted to the magnet, at the positions corresponding to the magnets.

3. The display device according to claim 1, wherein the magnetic device comprises one or more magnets which are fixedly attached to the mold frame and provided between the display panel and the mold frame, and the magnets are attracted to the display panel through the magnetic field they generate so that the display panel is fixedly attached to the mold frame through the magnets.

4. The display device according to claim 3, wherein the display panel has a polarity opposite to that of the magnet at positions corresponding to the magnets, or the display panel are provided with metal sheets which can he attracted to the magnet at the positions corresponding to the magnets.

5. The display device according to claim 3, wherein the magnetic force adjustable member comprises one or more electromagnetic coils formed at positions on the display panel corresponding to the magnets, wherein,
   when detaching the display panel from the mold frame, the electromagnetic coils are powered on so as to generate magnetic force with which the display panel and the mold frame are separated from each other, wherein the magnetic force is larger than that of the magnet which allows the display panel and the mold frame to attract mutually.

6. The display device according to claim 3, wherein the magnetic force adjustable member comprises one or more electromagnetic coils formed at positions on the display panel corresponding to the magnets, wherein,
   during normal operation of the display device, the electromagnetic coils are powered on so as to generate magnetic force with which the display panel and the mold frame are attracted mutually.

7. The display device according to claim 3, wherein the magnets re adhered to the mold frame through a. double-sided adhesive tape.

8. The display device according to claim 1, wherein the mold frame has a polarity opposite to that generated when the electromagnetic coils are powered on at a position corresponding to the electromagnetic coils, or the mold frame is provided with metal sheets which can be attracted by magnetic force generated when the electromagnetic coils are powered on at positions corresponding to the electromagnetic coils.

9. The display device according to claim 1, wherein the magnets are adhered to the display panel through a double-sided adhesive tape.

10. The display device according to claim 1, wherein the magnets are permanent soft. magnets.

11. The display device according to claim 1, wherein the first substrate is an array substrate and the second substrate is a color filter substrate.

12. The display device according to claim 1, wherein the display device farther comprises one or more buffer pads located between the display panel and the mold frame.

13. The display device according to claim 1, wherein the module is a backlight module which further comprises a backlight unit, and the back plate is located outside the backlight unit.

* * * * *